(12) United States Patent
Lindsey, Jr.

(10) Patent No.: US 7,807,479 B1
(45) Date of Patent: Oct. 5, 2010

(54) METHOD AND APPARATUS FOR IMPROVING FORCE CONTROL IN WAFER SCRIBING

(75) Inventor: Paul C. Lindsey, Jr., Lafayette, CA (US)

(73) Assignee: Micro Processing Technology, Inc., Lafayette, CA (US)

( * ) Notice: Subject to any disclaimer, the term of this patent is extended or adjusted under 35 U.S.C. 154(b) by 711 days.

(21) Appl. No.: 11/708,834

(22) Filed: Feb. 21, 2007

(51) Int. Cl.
*H01L 21/00* (2006.01)

(52) U.S. Cl. .................. 438/7; 438/8; 438/9; 438/462; 257/E21.521; 257/E21.529

(58) Field of Classification Search .................... 438/5, 438/7, 8, 9, 462; 257/E21.521, E21.529
See application file for complete search history.

(56) References Cited

U.S. PATENT DOCUMENTS

| | | | |
|---|---|---|---|
| 3,094,785 A | 6/1963 | Kulicke, Jr. | |
| 4,966,520 A * | 10/1990 | Yokota et al. | 414/816 |
| 5,820,006 A * | 10/1998 | Turner | 225/96 |
| 2004/0135232 A1 * | 7/2004 | Bakel et al. | 257/620 |

* cited by examiner

*Primary Examiner*—Julio J Maldonado
(74) *Attorney, Agent, or Firm*—Thomas R. Lampe

(57) ABSTRACT

When scribing a substrate, the precise location of the outer peripheral edge of the substrate on a stage is determined and movement of a scribe tool is controlled to first bring the scribe tool into engagement with the substrate at a location inwardly of the outer peripheral edge of the substrate. After a downwardly directed force of predetermined magnitude exerted by the scribe tool has been attained and stabilized, the scribe tool is moved along the substrate to form a scribe line.

9 Claims, 4 Drawing Sheets

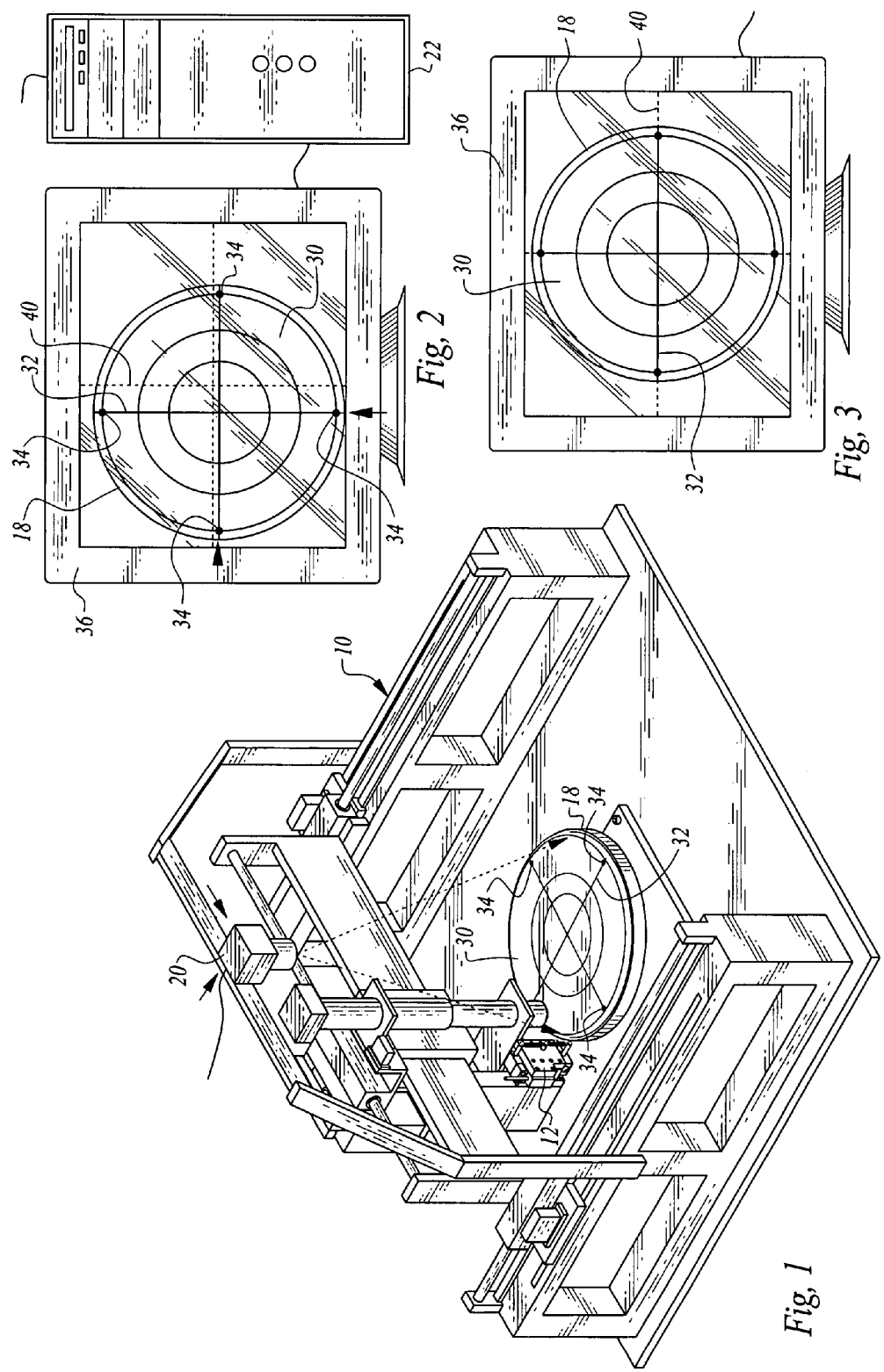

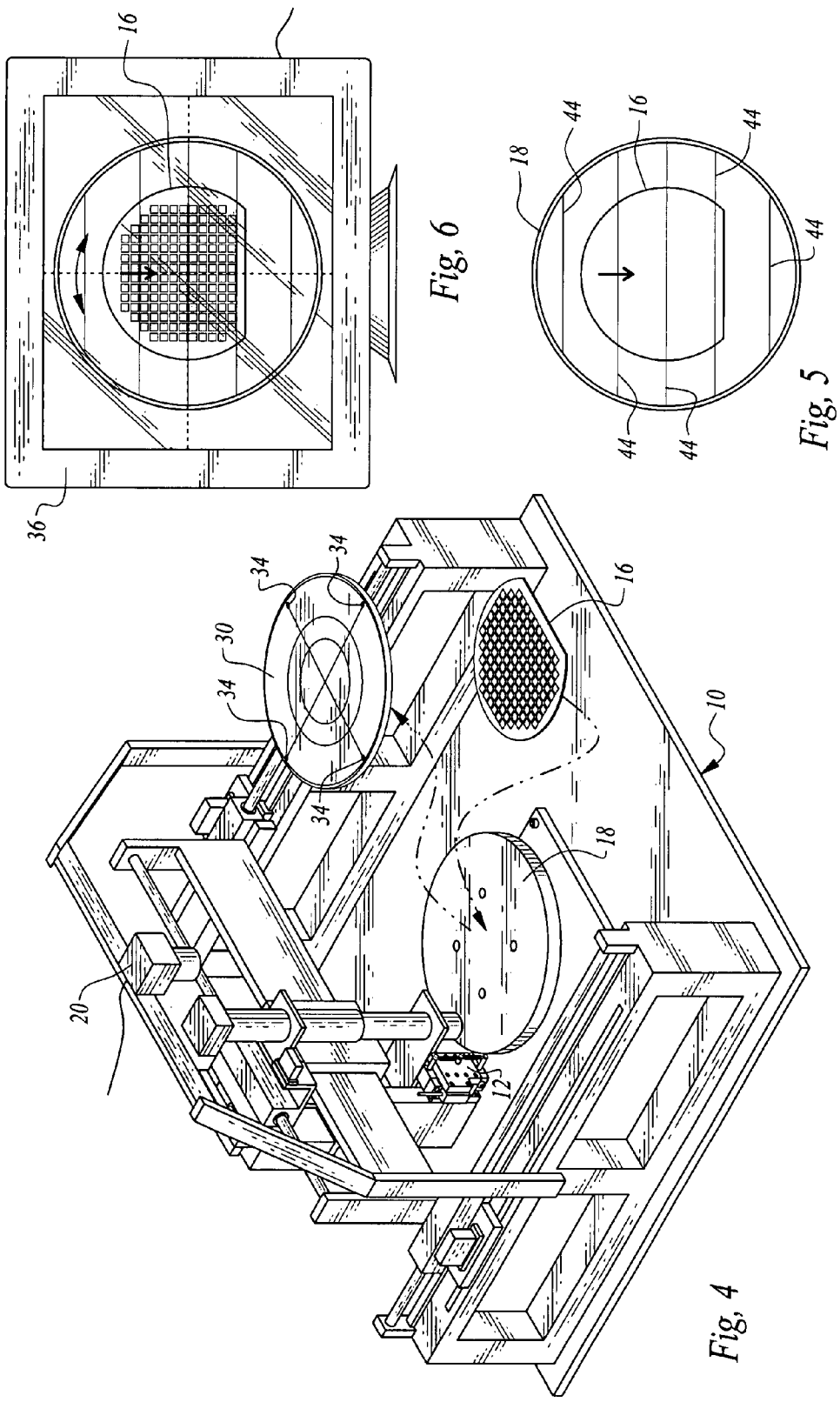

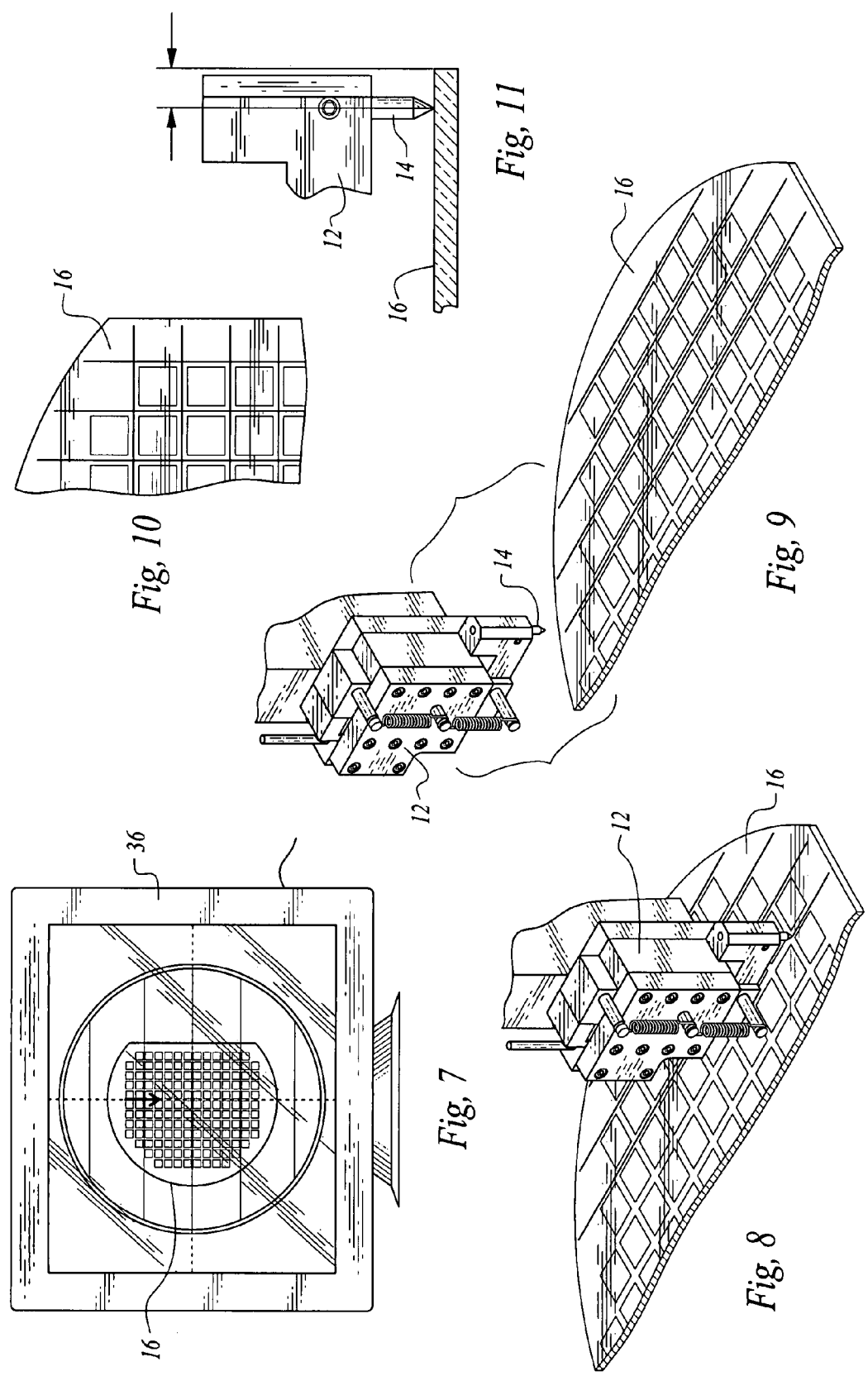

METHOD AND APPARATUS FOR IMPROVING FORCE CONTROL IN WAFER SCRIBING

TECHNICAL FIELD

This invention relates to a method of controlling movement and scribing force of a scribe tool of scribing apparatus relative to a semiconductor wafer or other substrate having an outer peripheral edge. The invention also encompasses a combination of structural elements for achieving the same end.

BACKGROUND OF THE INVENTION

After devices or circuits are fabricated on a semiconductor wafer and similar substrates, the individual devices or circuits may be separated by scribing the wafer with a scribing tool, such as a sharply pointed scribe tip, and cleaving the wafer along the scribed lines.

Current apparatus used to scribe a semiconductor wafer do not include a means or method of determining where the outer peripheral edge of the wafer is located before starting to scribe the wafer. Exemplary of prior art approaches are U.S. Pat. No. 3,094,785 and U.S. Pat. No. 5,820,006.

In these and similar apparatus, the scribe tip is placed outside the edge of the wafer and at a height just lower than the height of the wafer. The scribe tip is moved laterally relative to the wafer until it comes into contact with the wafer edge. It then continues across the wafer, forming a scribe line until it falls off the other side of the wafer.

Using this approach to wafer scribing causes two problems. First, when the scribe tip hits the leading edge of the wafer, damage to the wafer in the form of chips or cracks can occur. The second problem is that when the scribe tip hits the edge of the wafer it is knocked upward by the edge of the wafer and then oscillates up and down as the mechanism tries to dampen the mechanical perturbations in an attempt to maintain a constant scribe force.

DISCLOSURE OF INVENTION

Utilizing the teachings of the invention disclosed and claimed herein, the edge of the wafer to be scribed is located before the scribe tip is moved into position. This allows positioning of the scribe tip on the wafer or other substrate just inside the edge and stabilization of the scribe force before the start of the scribe motion across the wafer. This results in better control of the scribe force and eliminates cracks or chips at the edge of the wafer which would otherwise be caused by engagement of the wafer edge by the scribe tool.

The method of controlling movement and scribing force of a scribe tool of scribing apparatus relative to a semiconductor wafer or other substrate according to the teachings of the present invention includes positioning the substrate having an outer peripheral edge on a stage.

After the positioning step, the location of the outer peripheral edge on the stage is determined.

After determining the location of the outer peripheral edge, the scribe tool is moved relative to the substrate to a position above a predetermined location on the substrate inwardly of the outer peripheral edge without causing contact between the scribe tool and the outer peripheral edge.

The scribe tool is then brought into engagement with the substrate at the predetermined location. After such engagement, the scribe tool is employed to exert a downwardly directed force of predetermined magnitude on the substrate. After the downwardly directed force of predetermined magnitude has been attained and stabilized, movement of the scribe tool is caused along the substrate to form a scribe line in the substrate.

The combination of structural elements encompassed by the invention includes scribing apparatus including a stage for supporting a semiconductor wafer or other substrate having an outer peripheral edge, a scribe tool, and scribe tool moving structure for moving the scribe tool relative to the stage responsive to signals from a control computer.

The structural combination also includes edge locator structure for determining the location of the outer peripheral edge of a substrate on the stage operatively associated with the scribe tool moving structure after determining the location of the outer peripheral edge to move the scribe tool relative to the substrate to a position above a predetermined location on the substrate inwardly of the outer peripheral edge without causing contact between the scribe tool and the outer peripheral edge.

The scribe tool is brought into engagement with the substrate by the scribe tool moving structure at the predetermined location to exert a downwardly directed force of predetermined magnitude on the substrate. After the downwardly directed force of predetermined magnitude has been attained and stabilized, the scribe tool is moved along the substrate to form a scribe line in the substrate.

Other features, advantages and objects of the present invention will become apparent with reference to the following description and accompanying drawings.

BRIEF DESCRIPTION OF DRAWINGS

FIG. 1 is a perspective view of apparatus constructed in accordance with the teachings of the present invention, including a scribe tool, a scribe tool holder, a multi-stage gantry for moving the scribe tool, a stage for supporting a substrate to be scribed, but in this instance supporting an alignment and calibration target utilized when practicing the method of the present invention, and a movable camera for capturing an image of the stage and target;

FIG. 2 is an elevational view of a monitor displaying the image captured by the camera off center, as well as a control computer operatively associated with the monitor;

FIG. 3 is an elevational view of the monitor with the image of the stage and alignment and calibration target supported thereby centered on the monitor screen.

FIG. 4 is a view similar to FIG. 1, but illustrating the alignment and calibration target having been removed from the stage and a substrate in the form of a semiconductor wafer just prior to positioning on the stage;

FIG. 5 is a diagrammatic, top view illustrating pixel lines extending across the wafer and beyond, the wafer being supported by the stage;

FIG. 6 is a view similar to FIG. 3, but illustrating the wafer and stage;

FIG. 7 is a view similar to FIG. 6, but illustrating the stage and wafer rotated ninety degrees;

FIG. 8 is an enlarged, perspective view illustrating the tool holder and scribe tool held thereby engaging the wafer and forming a scribe line therein;

FIG. 9 is a perspective view of the tool holder and scribe tool poised above the wafer just inside the outer peripheral edge thereof prior to engaging the wafer to form a new scribe line;

FIG. 10 is a plan view of a portion of the wafer scribed both vertically and horizontally and prior to breaking along the scribe lines;

FIG. 11 is a side, elevational view illustrating the scribe tool engaging the wafer just inside the outer peripheral edge thereof.

BEST MODE FOR CARRYING OUT THE INVENTION

Figure 12:
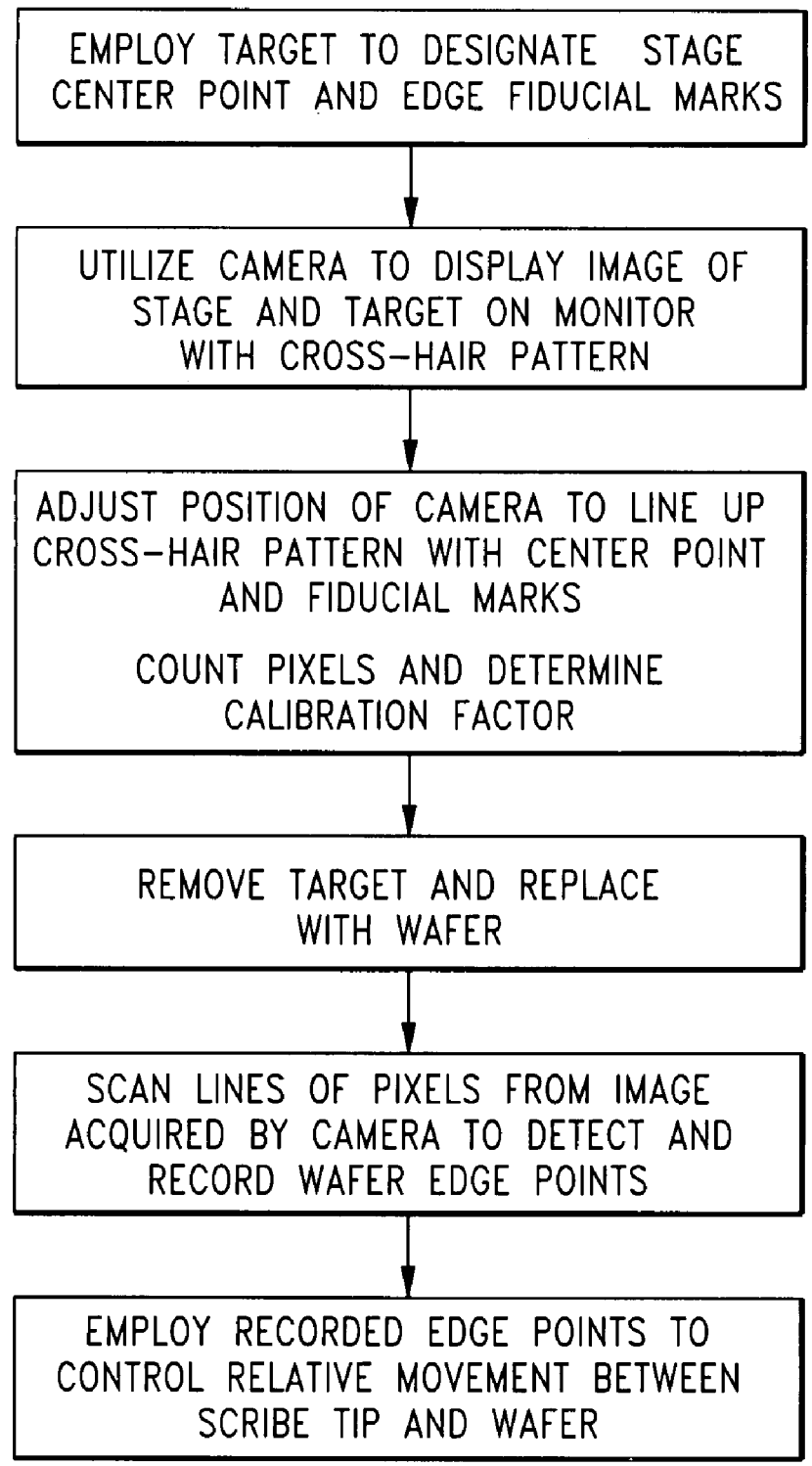
FIG. 12 is a block diagram illustrating selected sequential steps of the method of the present invention

Referring now to the drawings, apparatus constructed in accordance with the teachings of the present invention is illustrated. The apparatus includes a gantry-type scribing machine or apparatus 10, which may be of the type shown in U.S. Pat. No. 6,826,840, issued Dec. 7, 2004. The scribing apparatus 10 includes a tool holder 12 which supports a scribe tool 14 with a lower pointed end for engaging a semi-conductor wafer to form scribe lines therein. The wafer, shown in FIGS. 4-11, is identified by reference numeral 16. As taught by U.S. Pat. No. 6,826,840, the force applied to the wafer 16 is controlled by an encoder detecting flexing of the scribe tool holder. The wafer 16 is supported against movement by a stage 18.

The scribing apparatus differs from that of U.S. Pat. No. 6,826,840 in that it has adjustably mounted thereon above the stage 18 a camera 20 having an appropriate lens to view the wafer and stage. The camera 20 is operatively connected to a suitably programmed control computer 22 (FIG. 2) that includes a frame grabber to acquire the image of the wafer and stage.

Before a wafer is placed on the stage 18, an alignment and calibration target 30 is placed on the stage, as shown in FIG. 1. The target 30 contains a cross 32 to designate the center point of the stage 18 and for fiducial marks 34 near the outer peripheral edge of the stage. Two of the fiducial marks are located on one of the lines forming the cross and the other two are located on the other line of the cross perpendicular thereto. The distance between the center of the stage and each of the fiducial marks has been previously measured and recorded.

One of the structural components of the structural combination of the present invention is a computer monitor 36 operatively associated with the control computer 22. As shown in FIGS. 2 and 3, a cross-hair pattern 40 is projected on the computer monitor 36 along with the image of the stage 18 supporting the alignment target 30 produced by camera 20. This cross-hair pattern 40 is positioned to bisect the full image from the camera 20 in both the horizontal and vertical directions.

The position of the camera 20 is mechanically adjusted until the cross-hair pattern projected on the computer monitor lines up, as shown in FIG. 3, with the center cross of the alignment and calibration target 30 and with each of the fiducial marks 34 near the edge of the stage. The alignment of the camera is now such that the center line of the camera (lens) corresponds to the center point of the stage.

The number of pixels in the image between the center of the stage and each of the fiducial marks is determined by suitable programming of the control computer 22. Using these numbers, the calibration factor between the dimensions on the stage and the number of pixels along each line between the center point of the stage and each fiducial mark in the image is calculated.

The alignment and calibration target 30 is now removed from the stage 18 and the wafer 16 to be scribed is placed on the stage. This operation is illustrated in FIG. 4. FIG. 6 shows the view of the wafer on the stage and the wafer being centered on the stage.

Using a computer program of control computer 22, a horizontal line of pixels from the image acquired by the camera 20 is scanned to find abrupt changes in the intensity of adjacent pixels that correspond to the edge of the wafer along that line of pixels. This approach is illustrated schematically in FIG. 5.

When the scanning locates an edge of the wafer 16, the X-coordinates of the point are recorded by the computer program along with the Y-coordinates of the line. To determine the location of a large number of points along the peripheral edge of the wafer, the horizontal line is first placed just inside the top of the image of the stage and is successively moved by a chosen increment in a downward direction, as illustrated by the arrow in FIG. 5, with the computer program finding and recording edge points on each line, until the line reaches a position just inside the lower edge of the image of the stage.

If the stage is circular in shape, the radius of the stage is measured and converted to a length in pixels using the previously determined calibration factor. The length of the scanned horizontal line changes as the line is moved down the image of the stage. At each Y-position, the starting point of the scanned horizontal line is found by the computer program using the formula:

$$X=-SQRT[(R-d)^2-Y^2]$$

and the ending point for the scanned horizontal line is found by the formula:

$$X=SQRT[(R-d)^2-Y^2]$$

where:
R=Radius of the stage
d=Small increment chosen to keep scan within image of stage
Y=Current horizontal position of scan.

If the stage is square or rectangular, the starting and ending positions of the scanned horizontal lines are chosen to be just inside the sides of the image of the stage.

As the computer records the detected edge points, they are converted from pixel location values to the actual coordinate positions on the stage using the previously determined calibration factor and are placed in a mathematical array. The array will have two values of X, one at the leading edge of the wafer and the other at the trailing edge, for each value of Y, uniquely defining the positions of the peripheral edges of the wafer or portion of a wafer.

The entire process of precisely locating the wafer is performed without moving any stages or camera and can be completed in a few milliseconds of computer processing time.

Before the scribe process can be started, it is necessary to rotate the stage in order to align the scribe streets between the individual die with the direction of travel of the scribe tip. This can be accomplished without losing the location of the wafer edges. During the rotation an encoder or similar measuring device measures the angle through which the stage is rotated. The computer program records this angle of rotation. The computer program converts the X-Y coordinates of the wafer edge positions to a circular coordinate system with each point on the edge represented by an angle and radial position. The computer program changes all angle values in the array of edge points by the angular distance moved by the stage. The computer program then converts the wafer edge coordinates back to an X-Y coordinate system.

After the array that describes the edge of the wafer has been found and the direction of the scribe tip travel aligned with the scribe streets, the actual scribe process can begin. The scribe tip is moved to a position that is just inside the leading edge of the wafer for the Y-position at which the scribe run is to take place. See FIG. 11. The distance inside the edge of the wafer (in FIG. 11, the distance between the opposed arrow heads) may be varied by entries into the computer program that controls the overall scribing process. As the scribe tip is lowered toward the wafer surface at this location, the computer program of control computer 22 monitors the force sensor attached to the scribe tip (See U.S. Pat. No. 6,826,840). When the output of the force sensor exceeds a pre-set value, the movement of the scribe tip is stopped as the scribe tip is on the surface of the wafer. Next, the computer controlled feedback loop for force control is engaged and the scribe force stabilizes at the desired value. Only after this has occurred, does the actual scribe run begin and the scribe tip moves across the wafer toward the trailing edge of the wafer. See FIG. 8. As the scribe tip moves across the wafer, the computer program is continuously monitoring its X-position. When it reaches a pre-set position just inside the trailing edge of the wafer, the scribe tip is raised from the wafer surface. The stages that move the scribe tip relative to the surface of the wafer move the scribe tip to the next scribe street and to the next starting position just inside the edge of the wafer. This is illustrated in FIG. 9.

By use of this method and apparatus it is possible to achieve excellent control of the force applied to the scribe tip as it moves across the wafer and to avoid chips and cracks at the leading edge of the wafer.

The invention claimed is:

1. A method of controlling movement and scribing force of a scribe tool of scribing apparatus relative to a semiconductor wafer or other substrate having an outer peripheral edge, said method including the steps of:

positioning the substrate having an outer peripheral edge on a stage;

after said positioning step, determining the location of the outer peripheral edge on said stage;

after determining the location of the outer peripheral edge, moving the scribe tool relative to the substrate to a position above a predetermined location on the substrate inwardly of the outer peripheral edge without causing contact between the scribe tool and the outer peripheral edge;

bringing the scribe tool into engagement with said substrate at said predetermined location;

after said engagement, employing said scribe tool to exert a downwardly directed force of predetermined magnitude on the substrate; and after said downwardly directed force of predetermined magnitude has been attained and stabilized, causing movement of said scribe tool along said substrate to form a scribe line in said substrate, said step of determining the location of the outer peripheral edge on said stage including placing an alignment and calibration target having indicia thereon on the stage, employing a camera above the alignment and calibration target to capture an image of the alignment and calibration target and stage, and after removal of the alignment and calibration target from the stage and replacement thereof by the substrate on the stage, utilizing information derived from the image to determine the actual coordinate positions of a plurality of spaced locations on the outer peripheral edge of the substrate.

2. The method according to claim 1 wherein the step of utilizing information derived from the image to determine the actual coordinate positions of a plurality of spaced locations on the outer peripheral edge of the substrate includes the steps of displaying the image on a monitor and employing the image to reposition and align said camera to center the camera relative to a center point of said stage.

3. The method according to claim 1 wherein movement of said scribe tool relative to said substrate is employed to consecutively scribe a plurality of spaced scribe lines in said substrate, scribing of all of said scribe lines by said scribe tool beginning and ending inside the outer peripheral edge of said substrate and without engaging said outer peripheral edge with said scribe tool.

4. The method according to claim 1 wherein the indicia on said alignment and calibration target comprises a cross for centering on a center point of said stage and a plurality of fiducial marks at the ends of lines forming said cross.

5. A method of controlling movement and scribing force of a scribe tool of scribing apparatus relative to a semiconductor wafer or other substrate having an outer peripheral edge, said method including the steps of:

positioning the substrate having an outer peripheral edge on a stage;

after said positioning step, determining the location of the outer peripheral edge on said stage;

after determining the location of the outer peripheral edge, moving the scribe tool relative to the substrate to a position above a predetermined location on the substrate inwardly of the outer peripheral edge without causing contact between the scribe tool and the outer peripheral edge;

bringing the scribe tool into engagement with said substrate at said predetermined location;

after said engagement, employing said scribe tool to exert a downwardly directed force of predetermined magnitude on the substrate; and after said downwardly directed force of predetermined magnitude has been attained and stabilized, causing movement of said scribe tool along said substrate to form a scribe line in said substrate, said step of determining the location of the outer peripheral edge on said stage including placing an alignment and calibration target having indicia thereon on the stage, employing a camera above the alignment and calibration target to capture an image of the alignment and calibration target and stage, and after removal of the alignment and calibration target from the stage and replacement thereof by the substrate on the stage, utilizing information derived from the image to determine the actual coordinate positions of a plurality of spaced locations on the outer peripheral edge of the substrate by displaying the image on a monitor and employing the image to reposition and align said camera to center the camera relative to a center point of said stage, and after repositioning and alignment of said camera, determining pixel numbers between the center point of the stage and selected, spaced indicia of the alignment and calibration target displayed on the monitor and employing the pixel numbers to calculate a calibration factor.

6. The method according to claim 5 including the additional steps of, after replacing the alignment and calibration target on the stage with said substrate, scanning lines of pixels from an image of the substrate and stage acquired by said camera to detect edge points by finding changes in the intensity of adjacent pixels along said lines of pixels, recording the coordinates of the detected edge points in a computer program, and subsequently utilizing the recorded edge point coordinates to control movement of said scribe tool.

7. The method according to claim 6 including the step of utilizing said calibration factor to convert pixel location values for the detected edge points to actual coordinate positions on the stage.

8. The method according to claim 7 additionally comprising placing the actual coordinate positions on the stage in a mathematical array of X and Y values.

9. The method according to claim 8 including the steps of rotating the stage prior to scribing of the substrate to align scribe streets of the substrate with the direction of movement of the scribe tool, and inputting the angle of rotation into a computer program to record and maintain edge positions of the substrate.

* * * * *